(12) United States Patent
Wakamiya

(10) Patent No.: US 12,033,931 B2
(45) Date of Patent: Jul. 9, 2024

(54) ELECTRONIC COMPONENT HAVING AN ELEMENT AND ALLIGNED FIRST AND SECOND TERMINAL PORTIONS

(71) Applicant: CANON KABUSHIKI KAISHA, Tokyo (JP)

(72) Inventor: Hidehiro Wakamiya, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/352,525

(22) Filed: Jun. 21, 2021

(65) Prior Publication Data
US 2021/0407898 A1    Dec. 30, 2021

(30) Foreign Application Priority Data
Jun. 24, 2020  (JP) ................................. 2020-108661

(51) Int. Cl.
*H01L 23/498* (2006.01)
*G03G 15/00* (2006.01)
*H01L 31/02* (2006.01)
*G03G 15/043* (2006.01)

(52) U.S. Cl.
CPC ....... *H01L 23/49838* (2013.01); *G03G 15/80* (2013.01); *H01L 31/02002* (2013.01); *G03G 15/043* (2013.01)

(58) Field of Classification Search
CPC ...... G03G 15/80; G03G 21/14; G03G 15/043; G03G 15/04072; G03G 2215/0404; H01L 23/49838; H01L 31/02002
See application file for complete search history.

(56) References Cited

U.S. PATENT DOCUMENTS

| | | | |
|---|---|---|---|
| 6,403,895 B1 * | 6/2002 | Sota | H01L 24/06 361/767 |
| 2014/0138706 A1 | 5/2014 | Yoneyama et al. | |
| 2019/0332046 A1 * | 10/2019 | Shibahara | G03G 15/2064 |
| 2021/0359175 A1 * | 11/2021 | Sim | H01L 33/58 |

FOREIGN PATENT DOCUMENTS

| | | |
|---|---|---|
| JP | H07-240575 A | 9/1995 |
| JP | 2000-232180 A | 8/2000 |
| JP | 2003-224340 A | 8/2003 |
| JP | 2014-103183 A | 6/2014 |
| JP | 2018014437 A * | 1/2018 |

OTHER PUBLICATIONS

Feb. 27, 2024 Office Action in Japanese Patent Application Pub. No. 2020-108661 (with English translation).
May 14, 2024 Office Action in Japanese Patent Application Pub. No. 2020-108661 (with English translation).

* cited by examiner

*Primary Examiner* — Arlene Heredia
*Assistant Examiner* — Laura Roth
(74) *Attorney, Agent, or Firm* — Venable LLP

(57) ABSTRACT

An electronic component includes a substrate, an element mounted on a center portion of the substrate, a first terminal portion provided on the substrate at an edge of a first end portion of the substrate as seen in the element, and a second terminal portion provided on the substrate at an edge of a second end portion. The first terminal portion includes a first edge and a second edge in a direction perpendicular to a first direction from the element toward the first end portion and a length of the first edge is different from that of the second edge. The second terminal portion includes a third edge and a fourth edge in the direction and a length of the third edge is different from that of the fourth edge.

21 Claims, 6 Drawing Sheets

ELECTRONIC COMPONENT HAVING AN ELEMENT AND ALLIGNED FIRST AND SECOND TERMINAL PORTIONS

FIELD OF THE INVENTION AND RELATED ART

The present invention relates to an electronic component to be mounted on a substrate. Further, it relates to an image forming apparatus. In particular, it relates to the shape of the terminal of an electronic component.

There are two types of surface mount electronic component (which hereafter may be referred to simply as electronic component), that is, the one having a lead type terminal for soldering an electronic component to a substrate, and the one having a land-type terminal for soldering an electronic component to a substrate. A land-type terminal is formed of copper foil or the like. The latter one, or the one having a land-type terminal, is mounted on a substrate in the following manner: First, a preset amount of paste solder is placed on the patterned land on a substrate. Then, an electronic component is positioned so that the terminal of the electronic component comes into contact with the land on the substrate. Then, heat is applied to the solder to solder the component to the patterned land. The shape of the land-type terminal is rectangle as disclosed in Japanese Laid-open Patent Application No. 2014-103183.

The position on a substrate, into which an electronic component settles while it is mounted on a substrate is determined by the soldering process itself (self alignment). A surface mount electronic component is desired to be accurate in its position on a substrate. That is, it is desired not to deviate from a preset position on a substrate while it is mounted, for the following reason. An example of surface mount electronic component is a photosensitive electronic component employed by a laser beam printer or the like image forming apparatus. A photosensitive electronic component is provided with a photosensitive surface for sensing a beam of laser light to set the timing (distance from edge of sheet of recording medium) with which the image forming apparatus begins to write an image. Thus, if a photosensitive electronic component which is inaccurate in its position relative to a substrate is employed by an image forming apparatus, the image forming apparatus fails to begin writing an image at the preset point on a sheet of recording medium. That is, the positional relationship between a photosensitive electronic component and the substrate on which the photosensitive electronic component is mounted has a substantial amount of effect on an image forming apparatus in image quality. Therefore, it is desired to be ensured that a surface mount electronic component is accurately positioned relative to a substrate while it is mounted on the substrate.

SUMMARY OF THE INVENTION

According to an aspect of the present invention, there is provided an electronic component comprising: a first substrate; an element mounted on a center portion of said first substrate; a first terminal portion provided on said first substrate at an edge of a first end portion of said substrate as seen in said element; and a second terminal portion provided on said first substrate at an edge of a second end portion opposite to said first end portion of said substrate as seen in said element, wherein said first terminal portion includes a first edge and a second edge with respect to a direction perpendicular to a first direction from said element toward said first end portion, a length of the first edge being different from a length of the second edge, and wherein said second terminal portion includes a third edge and a fourth edge with respect to a direction perpendicular to a second direction from said element toward said second end portion, a length of the third edge being different from a length of the fourth edge.

Further features of the present invention will become apparent from the following description of exemplary embodiments (with reference to the attached drawings).

Figure 3:
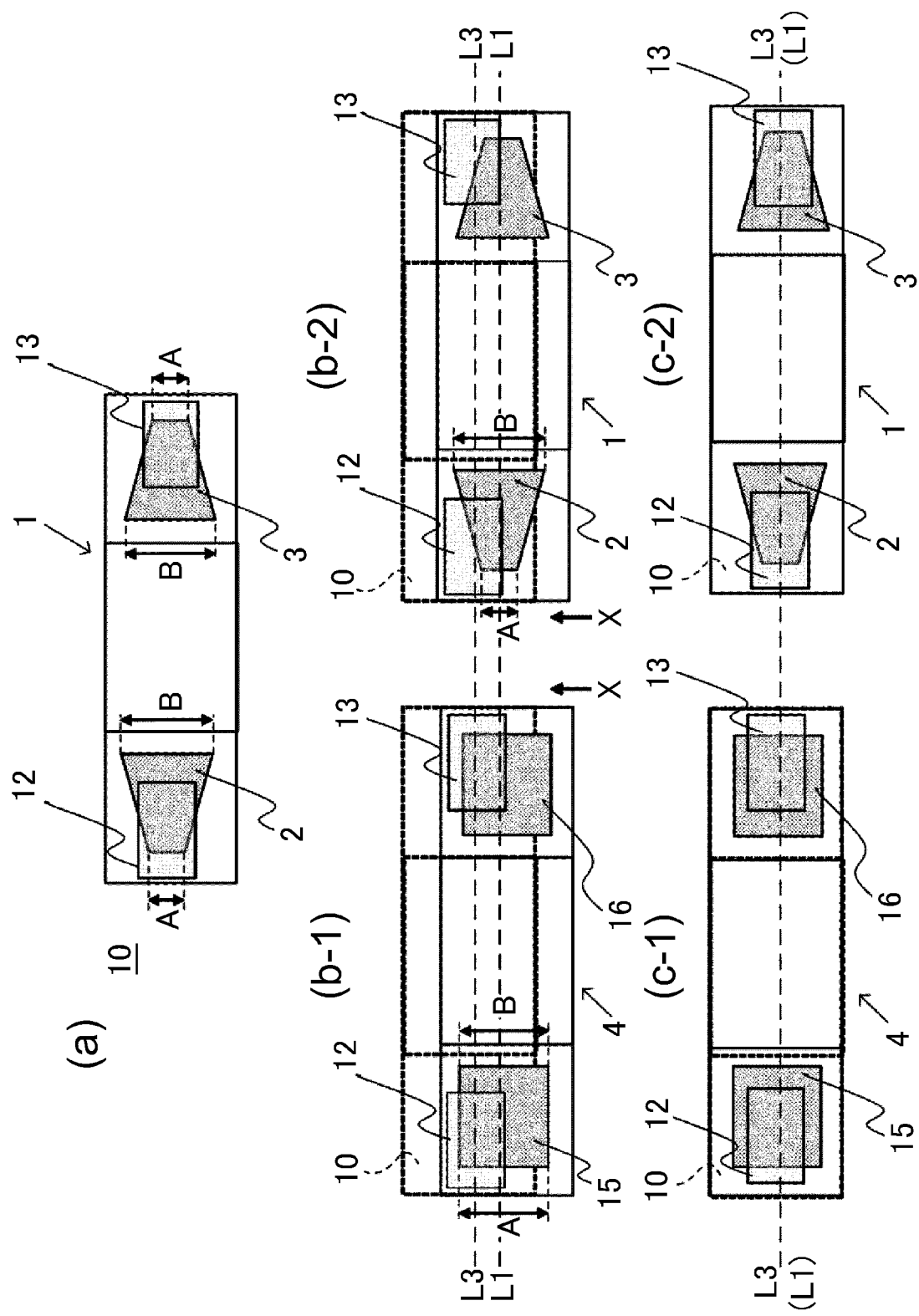

Part (a) of FIG. 3 is a drawing for showing the positional relationship between electronic component 1 and substrate 10, in the first embodiment; Parts (b-1) and (b-2) of FIG. 3, the positional relationship among the electronic components 1 and 4, and substrate 10 when the positional relationship between electronic component 1 and substrate 10, and the positional relationship between the electronic component 4 and substrate 10, are wrong after the mounting of the electronic components 1 and 4 on substrate 10; and Parts (c-1) and (c-2) of FIG. 3 are drawings for showing the positional relationship among the electronic components 1 and 4, and substrate 10 after the completion of the self alignment.

Figure 4:
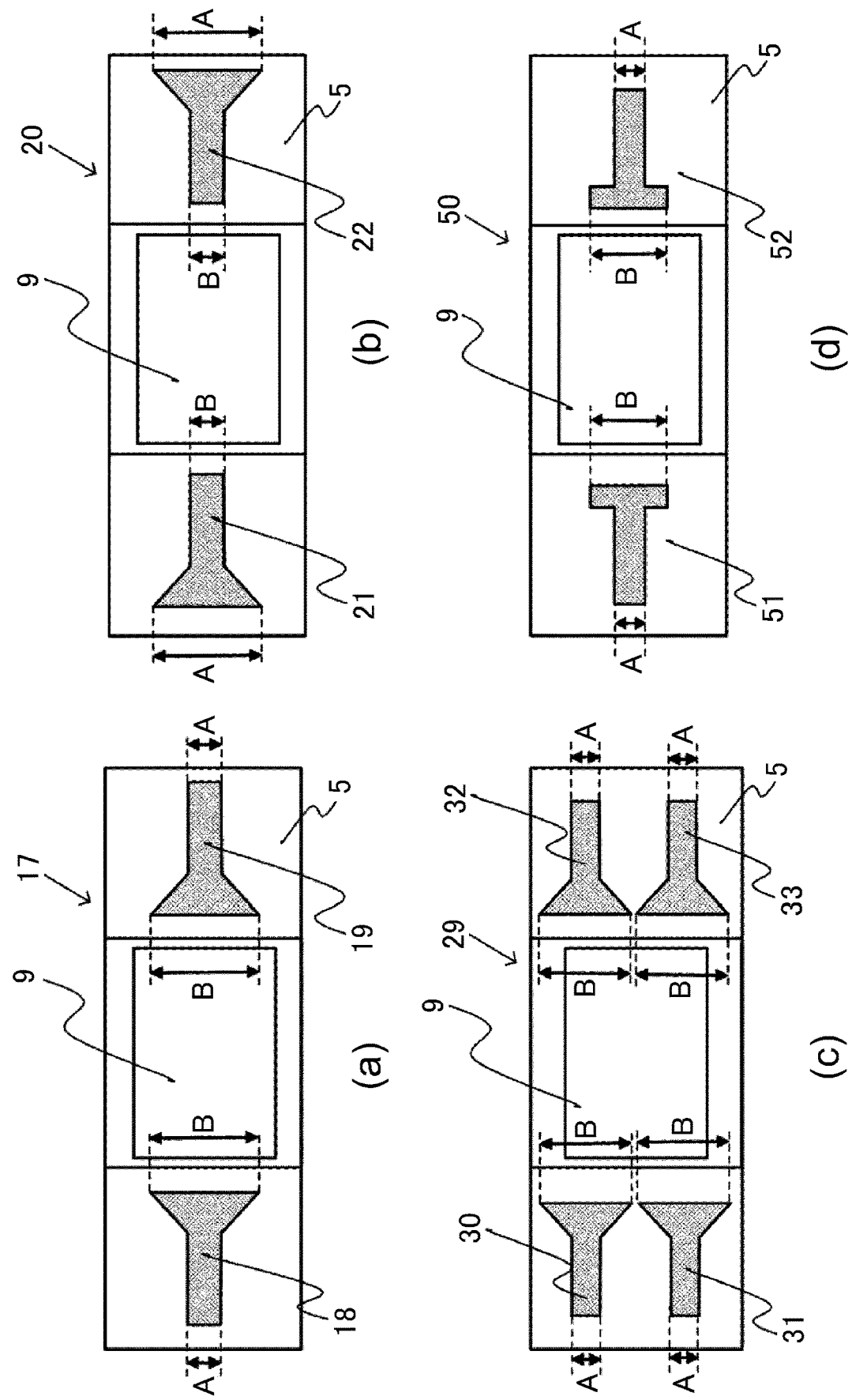

Parts (a) to (d) of FIG. 4 are drawings for showing the shapes of the terminals of electronic components 17, 20, 29 and 50.

Figure 5:
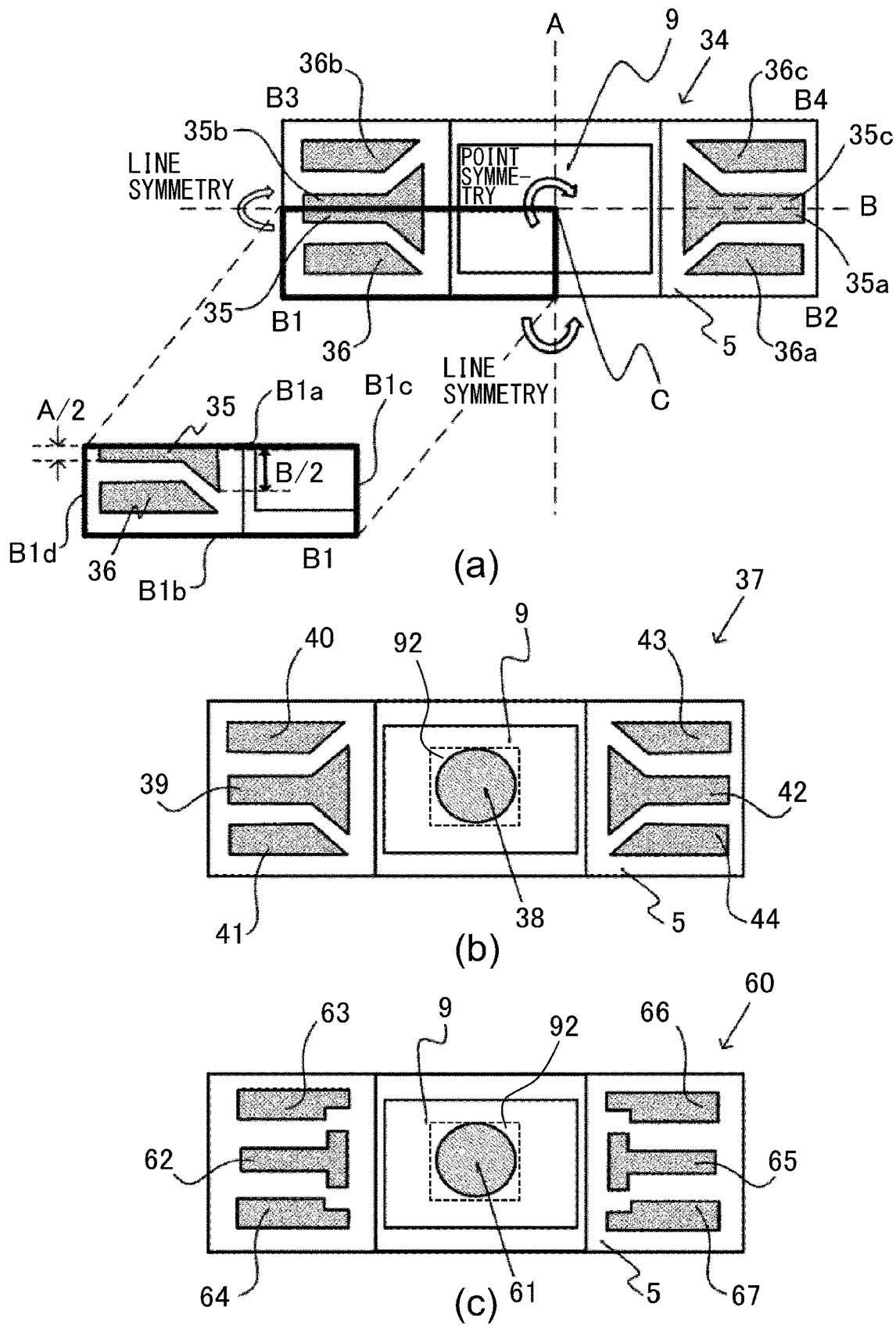

Parts (a) to (c) of FIG. 5 are drawings of electronic component 34 in the fourth embodiment, and electronic component 34 in the fourth embodiment.

Figure 6:
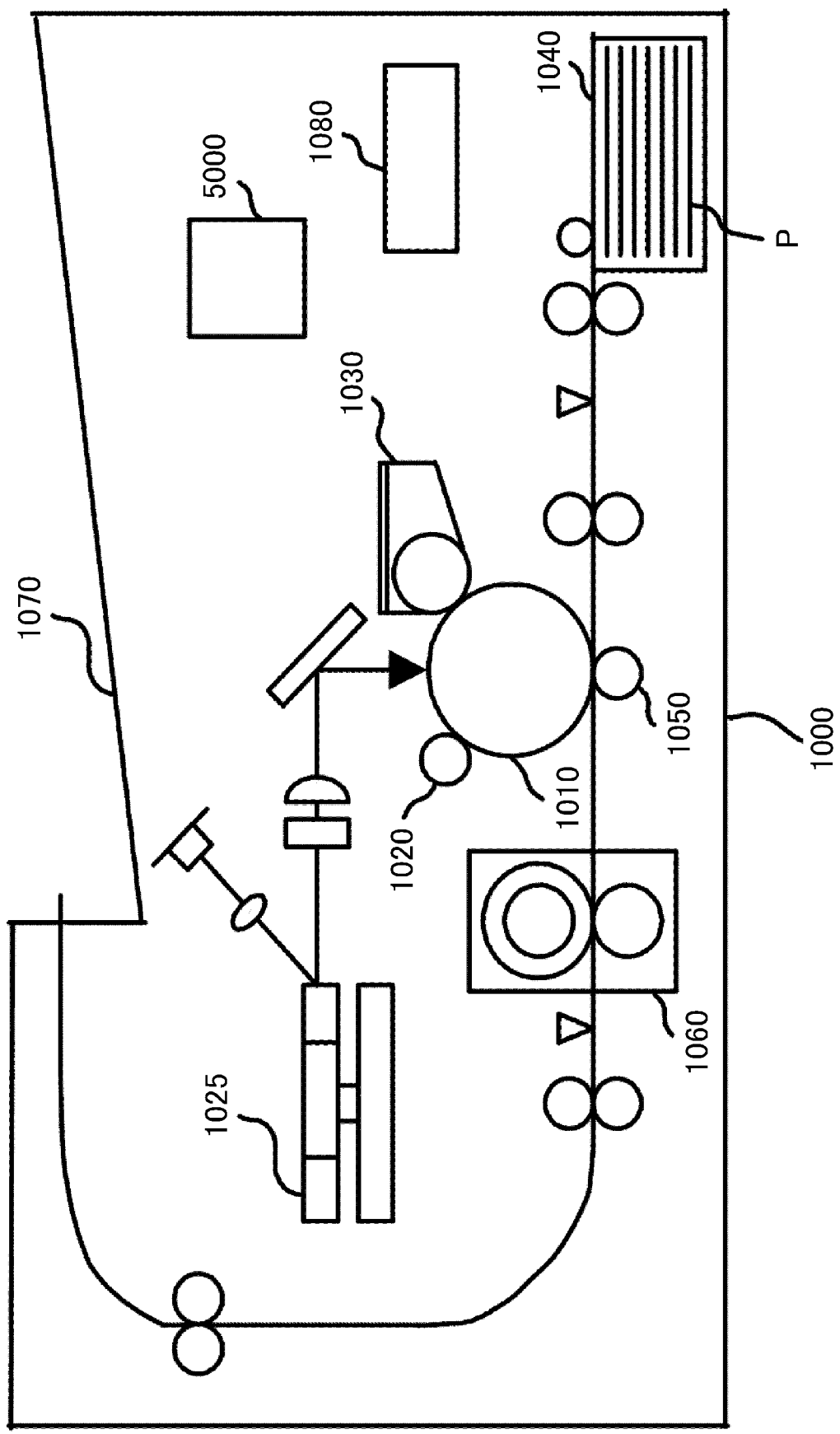

FIG. 6 is a schematic drawing of the image forming apparatus in the fourth embodiment; it shows the general structure of the apparatus.

DESCRIPTION OF THE EMBODIMENTS

Hereinafter, the present invention is described in detail with reference to a few of preferred embodiments of the present invention, along with appended drawings.

Embodiment 1

[Surface Mount Electronic Component]

Figure 1:
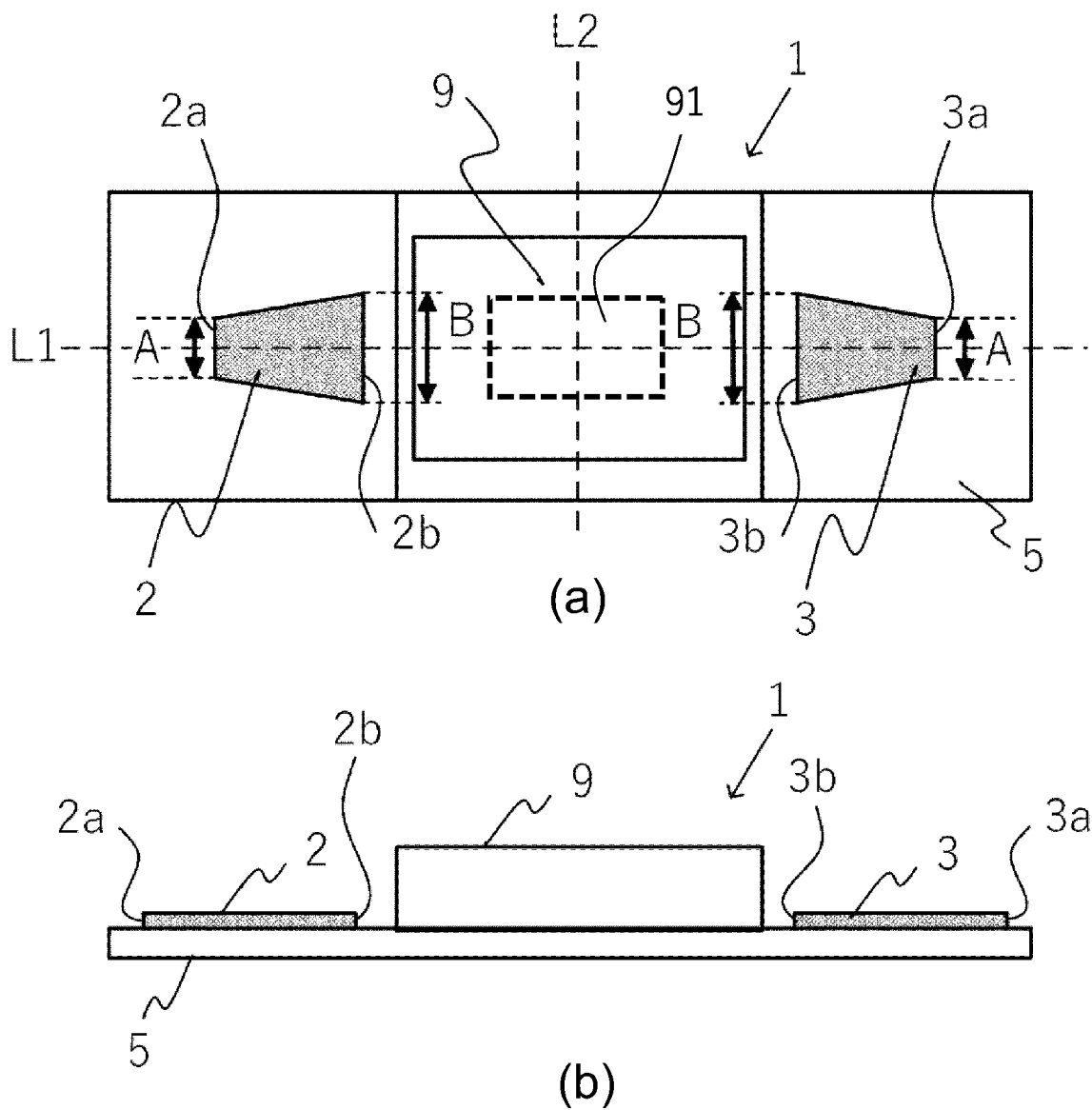
FIG. 1 is a combination of top and side views of electronic component 1 in the first embodiment of the present invention.

FIG. 1 is a drawing of the surface mount electronic components in the first embodiment of the present invention. By the way, the electronic component in this embodiment is of such a type that its substrate is provided with a hole for accommodating a semiconductor element. However, the present invention is also applicable to a surface mount electronic component of such a type that its substrate is provided with no hole for accommodating a semiconductor element. That is, this embodiment is not intended to limit the present invention is in scope. FIG. 1($a$) is a top view of electronic component 1. FIG. 1($b$) is a side view of electronic component 1. Electronic component 1 has at least one terminal for soldering, first substrate 5 (which hereafter will be referred to as substrate 5), semiconductor element 91 such as an IC chip, and mold 9 for keeping the semiconductor element 91 sealed to protect semiconductor element 91. As mold 9, a clear mold (mold formed of transparent resin) may be used. In this embodiment, electronic component 1 is provided with terminal 2 for soldering, and terminal 3 for soldering (which will be referred to as terminal 2 and terminal 3). Terminals 2 and 3 are of the so-called land type formed of copper foil or the like.

Terminal 2 has first and second edges 2b and 2a, which are roughly perpendicular to the first direction, which is parallel to the center-to-terminal direction of substrate 5. What characterizes the first embodiment is that first edge 2b of terminal 2 is different in length from second edge 2a of the terminal 2. Terminal 3 has first and second edges 3b and 3a, which are roughly perpendicular to the first direction, which is the center-to-terminal 3 direction of substrate 5. As far as edge length (which may be referred to as width) is concerned, terminal 3 is the same as terminal 2. By the way, the first direction is roughly parallel to first hypothetical line L1 which coincides with the center of substrate 5 in terms of the widthwise direction of substrate 5.

Terminals 2 and 3 are for soldering electronic component 1 to substrate 5. They are formed of copper foil or the like. Referring to FIG. 1, terminals 2 and 3 are in alignment with each other in the lengthwise direction of substrate 5. In this embodiment, the first direction mentioned above is roughly parallel to the lengthwise direction of substrate 5. Further, in terms of the direction which is parallel to bisector L1, first edges 2 and 3b are the inward edges of terminals 2 and 3, respectively. They have a width of A. Second edges 2a and 3a are the outward edges of terminals 2 and 3, respectively, and have a width of B. The shapes of terminals 2 and 3 are such that they satisfy (A<B). Hereafter, first edges 2b and 3b and second edges 2a and 3a may be referred to as width B edge and width A edge, respectively. In this embodiment, terminals 2 and 3 make up a pair of terminals which are symmetrically positioned relative to second hypothetical line L2, which coincides with substrate 5 in terms of the lengthwise direction of substrate 5.

Terminals 2 and 3 are in the form of such a trapezoid that satisfies: A<B. However, they may be different in shape from those in this embodiment as long as the inequality (A<B) is satisfied. Further, in the first embodiment, terminals 2 and 3 are formed on substrate 5 in such a manner that, in terms of the widthwise direction, the hypothetical line which coincides with the center of the edge with width A, and the center of the edge with width B, roughly coincides with second hypothetical line L2. FIG. 1(b) is a side view of electronic component 1. Substrate 5 functions as the sill for electronic component 1. Mold 9 keeps the IC chip (unshown) on substrate 5 sealed.

[Mounting of Electronic Component on Substrate]

Figure 2:
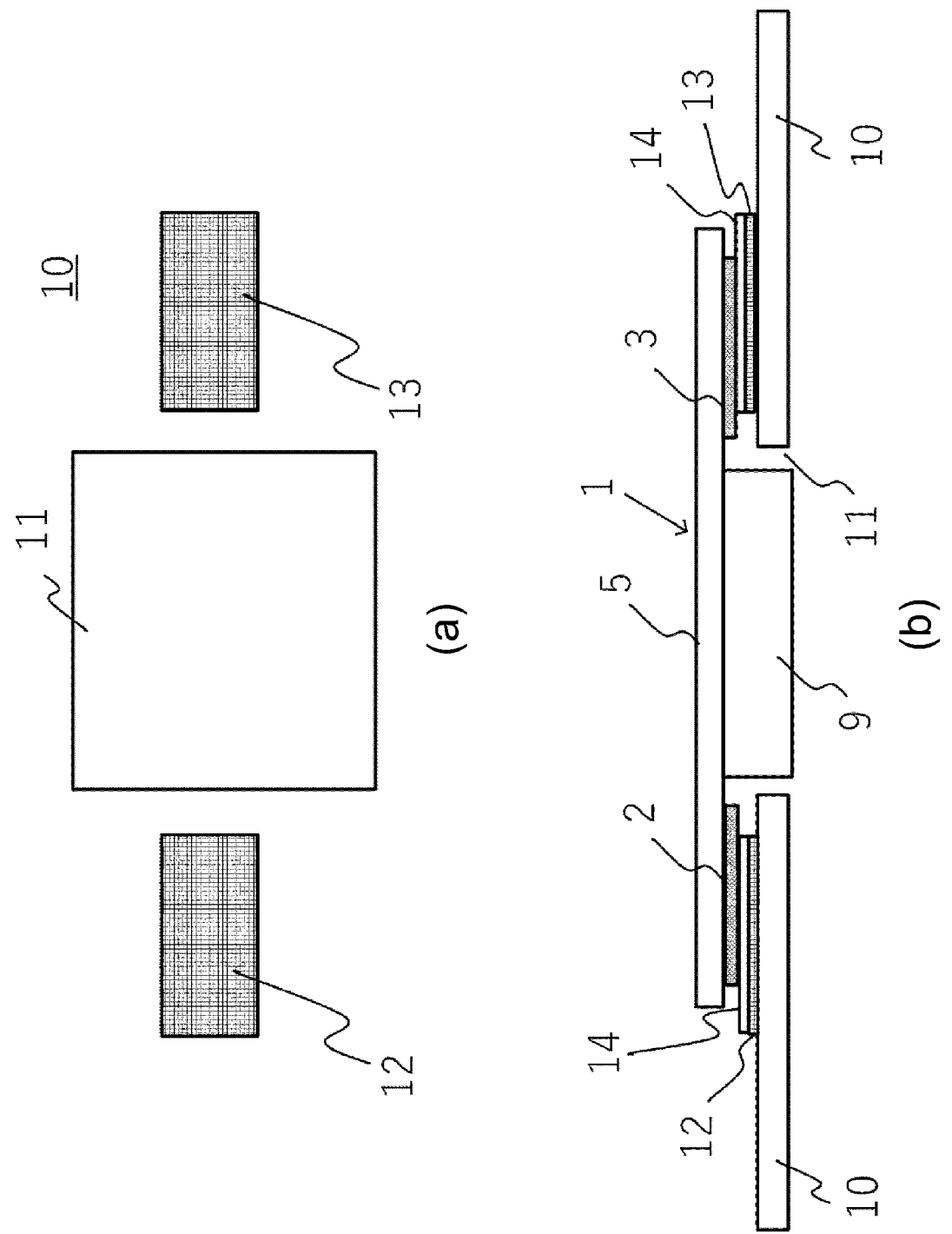
FIG. 2 is a combination of a top view of substrate 10 in the first embodiment, and a side views of electronic component 1 on substrate 10.

FIG. 2(a) is a top view of the second substrate 10 (which hereafter will be referred to as substrate 10), on which electronic component 1 is mounted. FIG. 2(b) is a sectional view of a combination of electronic component 1 and substrate 10 after the mounting of electronic component 1 on substrate 10. Substrate 10 is provided with a hole 11 to prevent substrate 10 and mold 9 from interfering with each other during the mounting of electronic component 1 onto substrate 10. Further, substrate 10 is provided with a pair of substrate lands 12 and 13 for making it possible for electronic component 1 to be soldered to substrate 10. Substrate lands 12 and 13 are formed of copper or the like. The process for mounting electronic component 1 on substrate 10 is as follows: First, a preset amount of paste solder 14 is applied to substrate lands 12 and 13. Then, electronic component 1 is positioned so that terminals 2 and 3 of electronic component 1 align with substrate lands 12 and 13, respectively, for soldering, as shown in FIG. 2(b). Then, the combination of substrate 10, electronic component 1, substrate lands 12 and 13, paste solder 14, etc, is put though a reflow furnace to melt the solder. Then, the combination is cooled to allow the solder to solidify to solidly attach electronic component 1 to substrate 10.

[Working of Self-Alignment]

FIG. 3(a) is a drawing for describing the positional relationship among terminal 2, terminal 3, and substrate lands 12 and 13, of electronic component 1 after the mounting of electronic component 1 on substrate 10. As electronic component 1 is mounted on substrate 10, the aforementioned combination is put through the furnace. Thus, heat is transmitted to the paste solder through the reflow layer, melting thereby the solder. As the solder melts, terminal 2 and substrate land 12 are subjected to the surface tension and wetting force of the solder, and so are terminal 3 and substrate land 13. Thus, electronic component 1 is moved by these forces, being thereby made to settle to a position where electronic component 1 remains stable in position. Hereafter, this process through which electronic component 1 is adjusted in position by the surface tension and wetting force of the solder will be referred to as "self alignment". In this embodiment, the relationship between terminals 2 and 3 in terms of their width is made to satisfy (A<B). Therefore, electronic component 1 is more reliably positioned in the center of substrate 10 by the self alignment than in a case where the relationship, in terms of width, between terminals 2 and 3 is (A=B).

Regarding the relationship, in width, between terminals 2 and 3, the reason why electronic component 1 is more reliably positioned in the center of substrate 5 when A<B than when A=B is described with reference to FIGS. 3(c-1) and 3(c-1). Here, in terms of the widthwise direction of the substrate land 12 and substrate land 13, the hypothetical centerline of the substrate land 12 and that of substrate land 13 will be referred to as the centerline L3 of the land. The first embodiment relates to a case where the area of the land, on which electronic component 1 is placed, is on the bottom side of the centerline L3 of the land. Here, the bottom side of center line L3 means the direction from center line L3 of the land toward one of the two edges of substrate 10 in terms of the widthwise direction of the substrate 10. In FIGS. 3(b-1) and 3(b-2), it is the bottom side of center line L3.

FIG. 3(b-1) relates to a case where the relationship, in width, between the terminals of an electronic component 4 is (A=B). FIG. 3(b-2) relates to a case where the relationship in width between the terminals is (A<B). Each drawing is a top view of the electronic component 4 after the placement of the electronic component on substrate 10. FIGS. 3(c-1) and 3(c-2) show the position of the electronic component 4 and that of electronic component 1, respectively, after the occurrence of self alignment triggered by the heat applied to the solders while the combination of substrate 5, electronic component 4, electronic component 1, solders, etc., was put through the reflow furnace. Both of the left drawings, that is, FIGS. 3(b-1) and 3(c-1), relate to the electronic component 4, the relationship, in width, between the terminals 15 and 16 of which is (A=B). The right drawings 3(b-2) and 3(c-2) show electronic component 1, the relationship in width between terminals 2 and 3 of which (first embodiment) is (A<B). By the way, otherwise, the electronic components 4 and 1 are similar in structure to each other.

The primary material for substrate lands 12 and 13, terminals 2 and 3, and terminals 15 and 16, is copper, which is easily wettable by solider. Electronic component 1 and electronic component 4 are placed on the easily wettable substrate lands 12 and 13 after the application of paste solder 14 to substrate lands 12 and 13. Then, the combination is put through the reflow furnace to apply heat to the paste solder 14 to liquefy the solder. If the solder is substantially greater in amount than substrate lands 12 and 13, the surface tension and wetting force of the solder act on substrate lands 12 and 13, and terminals 2 and 3 of electronic component 1, in a manner to increase the combination in the amount (size) of the overlap between substrate lands 12 and terminal 15, and that between substrate land 13 and terminal 16. "Size of overlap" means the size of the overlap between a terminal of an electronic component, and a substrate land of another substrate, with the presence of the paste solder between the substrate land and terminal. Hereafter, it will be simply referred to as "size of overlap of terminal (or substrate land)". Further, in the cases of the aforementioned combinations in FIG. 4, both the combination of terminal 2 and substrate land 13, and combination of terminal 3 and substrate land 13 (or combination of terminal 15 and substrate land 12, and combination of the terminal 16) are subjected to such a force that acts in the direction to increase the combinations in the size of overlap, that is, in the direction to move the electronic components 1 and 4 upward in the first embodiment. Thus, electronic component 1 and electronic component 4 move upward (X direction). Here, "upward direction" means the direction from center line L3 of the land toward one of the two edges of electronic component 1 or electronic components 1 and 4, in the widthwise direction.

FIGS. 3(*c*-1) and 3(*c*-2) show the positional relationship among the terminals, substrate lands, electronic component 4 after the completion of upward (indicated by referential code X) movement of electronic component 1 and electronic component 4, that is, after the combination became largest in the size of the overlap, when the relationship between the width A edge and width B edge is (A=B) and (A<B), respectively. Referring to FIG. 3(*c*-2), in a case where the relationship in width among the width A edge and width B edge B of the terminals is (A<B) as in the case of the first embodiment, the center of the substrate land 12 and the center of substrate land 13 (center line L3 of land) coincide with a position which makes the combination largest in the size of the overlap. Therefore, electronic component 1 moves in such a manner that its center (first hypothetical line L1) overlaps with center line L3 of the land. During this movement, it does not occur that as electronic component 1 moves, the top and bottom edges of the terminal become parallel to the top and bottom edges of substrate lands 12 and 13 of substrate 10. Here, "top edge of terminal" means one of the two edges of each terminal, which connect the width B edge and width A edge. "Bottom edge of the substrate land" means one of the two edges of the substrate land, which are parallel to center line L3 of the land, because terminals 2 and 3 of electronic component 1 are trapezoidal. Therefore, while the solder is remaining liquid, the top and bottom edges of terminal 2 and those of terminal 3 remain under the aforementioned rotational force. The rotational force which acts on terminal 2 is opposite in direction from that which acts on terminal 3. Therefore, as the two (terminals 2 and 3) become equal in the amount of the rotational force which acts on them, they stop moving. That is, while the solder remains liquid, the top and bottom edges of terminal 2 and those of terminal 3 always remain under the rotational force. Therefore, the two are likely to be more reliably centered relative to substrate lands 12 and 13, respectively.

Referring to FIG. 3(*c*-1), on the other hand, also in a case where the relationship between the width A edge and width B edge is (A=B), the electronic components 1 and 4 are moved to center of substrate lands 12 and 13 (centerline L3 of land) of substrate lands 12 and 13, respectively, by the surface tension and wetting force of the solder. However, the terminals 15 and 16 do not have an angled edge unlike terminals 2 and 3 in the first embodiment, which are trapezoidal (A<B). Therefore, the electronic component 4 is less stable in the location of the final position into which it is moved, compared to electronic component 1.

For the reason given above, the case in which the relationship between the width A edge and width B edge is (A<B) is superior to the case in which the relationship between the width A edge and width B edge is (A=B), regarding the positions (centerline L3 of land) into which electronic component 1 and 4 are going to be made to settle by the surface tension and wetting property of the solder. Moreover, the former is superior to the latter in that it can better ensure that the electronic component (1) remains in the center of substrate 10 than the latter (electronic component 4). By the way, in the first embodiment, terminals 2 and 3 were shaped so that the relationship between the widths A and B was (A<B). However, the relationship may be (B<A). Shaping terminals 2 and 3 as described above makes it possible to reliably mount a surface mount electronic component on the preset position (center) of a substrate.

As described above, the first embodiment makes it possible to reliably mount a surface mount electronic component on the preset position (center) on a substrate.

Embodiment 2

The second embodiment relates to a few cases in which the relationship between the width A edge and width B edge of the terminal of electronic component 1 in the first embodiment is (A<B) or (A>B). FIGS. 4(*a*)-4(*d*) show four electronic components, one for one, which are different in shape and positioning of terminals. FIGS. 4(*a*), (4*c*) and 4(*d*) relate to the cases, one for on, in which the relationship between A and B is (A<B). FIG. 4(*b*) shows an electronic component, the relationship between A and B is (A>B). An electronic component 17 in FIG. 4(*a*) has a substrate 5, a terminal 18, a terminal 19, and a mold 9. An electronic component 20 in FIG. 4(*b*) has a substrate 5, a terminal 21, a terminal 22, and a mold 9 which keeps a semiconductor element 91 such as an IC chip (which is not shown, since FIG. 4(*b*) is similar to FIG. 1) sealed. Electronic component 29 in FIG. 4(*c*) has substrate 5, terminal 30, terminal 31, terminal 32, terminal 33, and mold 9 which keeps an semiconductor chip such as an IC chip (which is not shown, since FIG. 4(*c*) is similar to FIG. 1) sealed. An electronic component in FIG. 4(*d*) has substrate 5, terminal 51, terminal 52, and mold 9.

Referring to FIG. 4, the terminals in FIGS. 4(*a*)-4(*c*) is shaped so that a part of each of the top and bottom edges is parallel to the top and bottom edges of the substrate land 12, and those of substrate land 13 of substrate 10, and also, so that another part of each of the top and bottom edges is not parallel to the top and bottom edges of substrate lands 12 and 13, respectively. For example, it is shaped like a sectional view of a funnel (which hereafter may be referred to as funnel shape). Shaping each terminal as described above always keeps the electronic components 17, 20 and 29 under the rotational force. Therefore, electronic component 17 (or electronic component 20, or the like) settles into a position in which the rotational force under which terminal 18 is, and the rotational force under which the terminal 19 is, are equal. Even if the two rotational forces remain equal, angled edges (top and bottom edges) of each terminal always remains under the rotational force. Therefore, it is better ensured that each electronic component is mounted on its preset position on substrate 5. By the way, the terminals in FIGS. 4(a) and 4(b) are shaped so that parts of the edges are angled relative to the corresponding edges of the substrate land as in the first embodiment described above. That is, they are shaped to better balance the leftward-rightward force relative to the upward-downward force.

Further, in the case of FIG. 4(c), the electronic component 29 is provided with four terminals arranged in such a manner that in the lengthwise direction of substrate 5, a pair of terminals are symmetrically positioned with reference to the center line of substrate 5 in terms of the lengthwise direction of substrate 5, and in terms of the widthwise direction, a pair of terminals are aligned in parallel. That is, the multiple (two) terminals on the left side, and the multiple (two) terminals are the same in shape. For example, multiple (two) pair of terminals which are symmetrically positioned with reference to the center line of substrate 5 in terms of the lengthwise direction of substrate 5 may be positioned side by side in terms of the widthwise direction. For example, the pair of terminals in FIG. 4(b) may be aligned in parallel in the widthwise direction of substrate 5, or multiple (two) pairs of terminals positioned as shown in FIG. 4(a) or 4(b) may be aligned in the widthwise direction of substrate 5. Shaping each terminal like the one in the second embodiment, as in the first embodiment, makes it possible to more reliably mount an electronic component on a preset position on substrate 5, than conventionally (rectangularly) shaping a terminal.

The terminals 51 and 52 in FIG. 4(d) are different in shape from those in FIGS. 4(a)-4(c); they are in the form of a letter T. In the case of the terminals 51 and 52 which are in the form of a letter T, by making the width B edge the same in length as the terminal of the substrate to which the terminals 51 and 52 (length of substrate lands 12 and 13 in widthwise direction), it is possible to make the aforementioned force to more reliably work than by shaping the terminals to satisfy (A=B).

As described above, the second embodiment makes it possible to more reliably mount a surface mount electronic component on a preset position on a substrate than any of conventional methods.

Embodiment 3

In the third embodiment, an electronic component is divided into four blocks by the bisector of substrate 5 in terms of the lengthwise direction of substrate 5, and the bisector of substrate 5 in terms of the widthwise direction of substrate 5. One of the four blocks will be referred to as a base block. The base block has at least one terminal. With reference to the two bisectors described above, and the intersection of the two bisectors, the terminals are symmetrically positioned to make the process of self-alignment more effective.

[Base Block]

FIG. 5(a) shows the shapes of the terminals of electronic component 34 in the third embodiment. Electronic component 34 has a substrate 5, and a mold 9. It comprises four blocks (four areas) B1, B2, B3 and B4, into which electronic component 34 is divided by the bisector A of substrate 5, which is perpendicular to the lengthwise direction of substrate 5, and bisector B of substrate 5, which is perpendicular to the widthwise direction of substrate 5. The bisector A is second hypothetical line L2, which is parallel to the widthwise direction of the circuit board cover 5, and also, coincides with the center of substrate 5 (FIG. 1). Bisector B is the first hypothetical line L2, which is parallel to the lengthwise edges of substrate 5. It is roughly parallel to the first direction described in the description of the first embodiment. By the way, the intersection of the two bisectors A and B may be referred to as intersection C. Block B1, which is the first of the four areas, will be referred to as the base block. The essential portions of base block B1 are shown in the bottom-left area of FIG. 4(a). Further, the lengthwise edge of base block B1, which overlaps with bisection B will be referred to as long edge B1a. The other long edge, which is different from long edge B1a, will be referred to as long edge B1b. The short edge of base block B1, which overlaps with the bisector A, will be referred to as short edge B1c. The other short edge of base block B1, which is different from short edge B1c, will be referred to as short edge B1d.

Base block B1 has terminals 35 and 36. Terminal 35 is in the form of one of the two sections, which results as terminal 18 in FIG. 4(a) which shows the terminals in the second embodiment is bisected by bisector B. More concretely, terminal 35 has an edge which is in contact with long edge B1a of base block B1, an edge which is not in contact with long edge B1a, but is parallel to long edge B1a, an edge which is parallel to the short edge B1d, and is A/2 in width, an edge which is parallel to the short edge B1d, and is B/2 in width, and an angled edge. It is in the form of one of the two sections which results as a funnel shape is bisected in the lengthwise direction. Terminal 36 is in the form of a trapezoid which has two edges which are parallel to long edges B1a and B1b of base block B1, an edge which parallel to short edges B1c and B1d of base block B1, and an edge which is parallel to the angled edge of terminal 35. In terms of the terminal shape, the second to fourth blocks B2~B4 are basically the same as first block B1, but, are different from base block B1 in the positioning of the terminals. First, in the case of block B2 which is the third area of electronic component 34, its terminals 35a and 36a are positioned to make block B2 symmetrical to the block B1 with reference to bisector A. Block B4, which is the fourth area of electronic component 34, coincides with the extension of one of the diagonal lines of base block B1. Its terminals 35c and 36c are positioned in such a manner that it is symmetrically positioned to the counterparts of base block B1 with reference to the intersection of the two bisectors of electronic component 34.

As described above, a block which mirrors base block B1 is symmetrically positioned with reference to bisector B, and another block which also mirrors base block B1, is symmetrically positioned with reference to the intersection C of the bisectors A and B, whereby a terminal which is shaped like terminal 18 in FIG. 4 is formed by a combination of terminal 35 and terminal 35b, and a terminal shaped like the terminal 19 in FIG. 4 is formed by the combination of the terminals 35a and 35c. By the way, terminal 35 may be shaped so that as a block which mirrors base block B1, and another block which also mirrors base block B1, are symmetrically positioned to base block B1, with reference to the bisectors and intersection C, respectively, a terminal shaped like terminal 21 in FIG. 4(b), and a terminal shaped like terminal 22 in FIG. 4(b), are obtained. In such a case, terminal 36 may be changed in shape so that it matches terminal 35 in shape.

Further, referring to FIG. 5(a), no less than two terminals of electronic component 34 are shaped so that a part of their top edge, and a part of their bottom edge, do not become parallel to the top or bottom edge of each of substrate lands 12 and 13 of substrate 10. As described above, by designing electronic component 34 to make the terminals of one of its blocks symmetrically shaped and positioned relative to those of another block, it is possible to make the edges of the terminals equal in the amount of vertical and horizontal forces to which the terminals are subjected. In addition, by shaping the terminals of the electronic component so that a part of their top edge, and a part of their bottom edge, do not become parallel to the top or bottom edge of each of substrate lands 12 and 13 of substrate 10, the top and bottom edges remain under the rotational force, making it likely for electronic component 34 to be stable in the position into which each of its terminals settles during the process of mounting electronic component 34 on substrate 10. By the way, in the third embodiment, there were six terminals on substrate 5. However, the present invention is also applicable to an electronic component, the number of the terminals of which is not six. Effects of such application are the same as those obtainable by the third embodiment.

Further, even though the electronic component in FIG. 5(c) has two terminals shaped like a letter T, effects similar to those obtainable by the electronic components in FIGS. 5(a) and 5(b) can also be obtained by shaping and positioning the terminals of the base block of the electronic component in FIG. 5(c) in such a manner that the terminals of other blocks are symmetrically positioned relative to the counterparts in the base block, with reference to the bisectors A or B, or the intersection of the bisectors A and B. By the way, the electronic component in FIG. 5(c) will be described later.

As described above, the third embodiment also can make the process of mounting a surface mount electronic component on a substrate, stable in the position on the substrate, into which the electronic component settles.

Embodiment 4

The fourth embodiment relates to an electronic component for detecting such light as a beam of laser light used to set the timing with which an image begins to be written by a laser beam printer or the like. To begin with, an image forming apparatus which comprises electronic components is described.

[Description of Laser Beam Printer]

FIG. 6 is a schematic sectional view of a laser beam printer 1000 (which may be referred to simply as printer 1000) as an example of image forming apparatus which is compatible with the present invention. It shows the general structure of the printer. The printer 1000 has a photosensitive drum 1010, a charging section 1020, and a developing section 1030. The photosensitive drum 1010 is a photosensitive component on which an electrostatic latent image is formed. The charging section 1020 uniformly charges photosensitive drum 1010. Optical scanning apparatus 1025, which is an exposing means, has a light emitting element for emitting a beam of laser light. It forms an electrostatic latent image on photosensitive drum 1010 by scanning photosensitive drum 1010 with the beam of laser light emitted by optical scanning apparatus 1025 while being modulated by the data of the image to be formed. Developing section 1030, which is a developing means, forms a toner image by developing the electrostatic latent image on photosensitive drum 1010 with toner. The toner image on photosensitive drum 1010 (photosensitive component) is transferred by transferring section 1050, which is a transferring means, onto a sheet P of recording medium, which is supplied from cassette 1040. The unfixed toner image on sheet P is fixed by fixing device 1060. Then, sheet P is discharged into tray 1070. These photosensitive drum 1010, charging section 1020, developing section 1030, and transferring section 1050 make up an image forming section. Further, printer 1000 has electric power source apparatus 1080, which supplies a driving section such as a motor, and control section 5000, with electric power.

Control section 5000 has a CPU (unshown). It controls an image forming operation which is carried out by an image forming section, an operation to convey sheet P, and the like. Optical scanning apparatus 1025 has an electronic component for detecting light. It has a light sensitive surface for detecting a beam of laser light. This electronic component is called a beam detection sensor. It is used to detect a beam of laser light before the beam of laser light is projected upon photosensitive drum 1010. As the beam detection sensor detects a beam of laser light, it outputs a signal, which is inputted into control section 5000, which can adjust the exposing means in the timing with which a beam of laser light is emitted by the exposing section, based on the inputted signal. Thus, control section 5000 can adjust exposing means in the timing with which the start of forming the electrostatic laten image on the photosensitive drum 1010. By the way, an image forming apparatus which can employ an electronic component which is compatible with the present invention is not limited in choice to the one structured as shown in FIG. 6.

[Electronic Component for Light Detection]

FIG. 5(b) shows the shape of electronic component 37 for light detection in the fourth embodiment of the present invention. Electronic component 37 for light detection has light sensing section 38 (light sensing surface), which detects (catches) laser light, and outputs a signal, as such light, as a beam of laser light is emitted by the exposing means in a manner to scan the photosensitive component. Further, it has: substrate 5; mold 9 which keeps sensor element 92 having light sensing surface 38 sealed; and terminals 39, 40, 41, 42, 43 and 44 shaped like those in the third embodiment. By the way, in the fourth embodiment, they are shaped like those in the third embodiment. However, they may be shaped like those in the first and second embodiments. By shaping the terminals as described above, it is possible to reliably position electronic component 37 in the center of land 12 or 13 while mounting electronic component 37 on substrate 10.

FIG. 5(c) shows the shape of an example of modified electronic component 60 for light detection. Electronic component 60 for light detection has photosensitive surface 61. Further, electronic component 60 has: substrate 5; mold 9 which keeps sensor element 92 having photosensitive surface 38 sealed; and terminals 62, 63, 64, 65, 66 and 67. Shaping the terminals as shown in FIG. 5(c) makes it possible to reliably position electronic component 60 in the center of land 12 or 13, when mounting electronic component 60 on substrate 10.

Therefore, it is assured that the terminals of the electronic components 37 and 60 for light detection are reliably placed on the preset positions on the substrate when the electronic components 37 and 60 are mounted. Therefore, even in the case of electronic components 37 and 60 for light detection, which are used by printer 1000 or the like, and the position of which on the substrate affects an image forming apparatus in the timing with which the apparatus begins to write an image, it is possible to stabilize the apparatus in the position at which it begins writing an image. Therefore, it is possible to stabilize the apparatus in image quality.

As described above, the fourth embodiment also can ensure that a surface mount electronic component is reliably placed on a preset position on a substrate during the mounting of the electronic component. While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-108661 filed on Jun. 24, 2020, which is hereby incorporated by reference herein in its entirety.

What is claimed is:

1. An electronic device comprising:
an electronic component including:
  (i) a first substrate including a mounting surface on which a first terminal portion and a second terminal portion are formed, and
  (ii) an element mounted on the mounting surface of the first substrate, the element being arranged between the first terminal portion and the second terminal portion, spaced from the first terminal portion and the second terminal portion, and in alignment with the first terminal portion and the second terminal portion,
  wherein, as viewed in a direction perpendicular to the mounting surface, the first terminal portion, the second terminal portion, and the element are aligned on a first hypothetical line extending along the mounting surface, the first terminal portion and the second terminal portion are symmetric with respect to a second hypothetical line that is perpendicular to the first hypothetical line and extends along the mounting surface; and
  (iii) a second substrate on which a first land and a second land is formed,
wherein the first land is electrically connected to the first terminal portion via solder applied on the first terminal portion, and the second land is electrically connected to the second terminal portion via a solder applied on the second terminal portion,
wherein, as viewed in the direction perpendicular to the mounting surface, the first terminal portion has a first side and a second side each extending (i) in a straight line in a direction that is parallel to the second hypothetical line and (ii) along the mounting surface, a length of the first side of the first terminal portion is longer than a length of the second side of the first terminal portion, and one of the first side of the first terminal portion and the second side of the first terminal portion is closer to the element than the other of the first side of the first terminal portion and the second side of the first terminal portion is to the element with respect to a direction that is parallel to the first hypothetical line,
wherein, as viewed in the direction perpendicular to the mounting surface, the second terminal portion has a first side and a second side of each extending (i) in a straight line in the direction that is parallel to the second hypothetical line and (ii) along the mounting surface, a length of the first side of the second terminal portion is longer than a length of the second side of the second terminal portion, and one of the first side of the second terminal portion and the second side of the second terminal portion is closer to the element than the other of the first side of the second terminal portion and the second side of the second terminal portion is to the element with respect to the direction that is parallel to the first hypothetical line,
wherein, as viewed in the direction perpendicular to the mounting surface, the first land and the first terminal portion overlap each other so that a first overlapping area is formed, and a length of the first overlapping area with respect to the direction that is parallel to the second hypothetical line is shorter than the length of the first side of the first terminal portion,
wherein, as viewed in the direction perpendicular to the mounting surface, the second land and the second terminal portion overlap each other so that a second overlapping area is formed, and a length of the second overlapping area with respect to the direction that is parallel to the second hypothetical line is shorter than the length of the first side of the second terminal portion.

2. The electronic component according to claim 1, wherein, as viewed in the direction perpendicular to the mounting surface, the first terminal portion has (i) a third side that connects the first side of the first terminal portion and the second side of the first terminal portion and (ii) a fourth side that connects the first side of the first terminal portion and the second side of the first terminal portion, the third side of the first terminal portion and the fourth side of the first terminal portion are symmetric with respect to the first hypothetical line,
wherein, as viewed in the direction perpendicular to the mounting surface, the second terminal portion has (i) a third side that connects the first side of the second terminal portion and the second side of the second terminal portion and (ii) a fourth side that connects the first side of the second terminal portion and the second side of the second terminal portion, the third side of the second terminal portion and the fourth side of the second terminal portion are symmetric with respect to the first hypothetical line, and
wherein the third side of the first terminal portion and the third side of the second terminal portion are symmetric with respect to the second hypothetical line, and the fourth side of the first terminal portion and the fourth side of the second terminal portion are symmetric with respect to the second hypothetical line.

3. The electronic component according to claim 2, wherein, as viewed in the direction perpendicular to the mounting surface, the third side of the first terminal portion forms a straight line from the first side of the first terminal portion to the second side of the first terminal portion.

4. The electronic component according to claim 2, wherein, as viewed in the direction perpendicular to the mounting surface, a first part of the third side of the first terminal portion forms a straight line in a direction that is parallel to the first hypothetical line and a second part of the third side of the first terminal portion forms a straight line in a direction that is angled to and intersects with the first hypothetical line.

5. The electronic component according to claim 2, wherein, as viewed in the direction perpendicular to the mounting surface, a first part of the third side of the first terminal portion forms a straight line in a direction that is parallel to the first hypothetical line, a second part of the third side of the first terminal portion forms a straight line in a direction that is parallel to the second hypothetical line, and a third part of the third side of the first terminal portion connects the first side of the first terminal portion and the second part of the third side of the first terminal portion.

6. The electronic component according to claim 5, wherein the third part of the third side of the first terminal portion forms a straight line in the direction that is parallel to the first hypothetical line.

7. The electronic component according to claim 6, wherein a length of the third part of the third side of the first terminal portion with respect to the direction that is parallel to the first hypothetical line is shorter than a length of the first part of the third side of the first terminal portion with respect to the direction that is parallel to the first hypothetical line.

8. The electronic component according to claim 5, wherein a length of the third part of the third side of the first terminal portion with respect to the direction that is parallel to the first hypothetical line is shorter than a length of the first part of the third side of the first terminal portion with respect to the direction that is parallel to the first hypothetical line.

9. The electronic component according to claim 1, the electronic component includes a third terminal portion, a fourth terminal portion, a fifth terminal portion, and a sixth terminal portion each mounted on the mounting surface,
wherein, as viewed in the direction perpendicular to the mounting surface, the first terminal portion is located between the third terminal portion and the fourth terminal portion, and the third terminal portion and the fourth terminal portion are symmetric with respect to the first hypothetical line,
wherein, as viewed in the direction perpendicular to the mounting surface, the second terminal portion is located between the fifth terminal portion and the sixth terminal portion, and the fifth terminal portion and the sixth terminal portion are symmetric with respect to the first hypothetical line.

10. The electronic component according to claim 9, wherein, as viewed in the direction perpendicular to the mounting surface, the third terminal portion and the fifth terminal portion are symmetric with respect to the second hypothetical line,
wherein, as viewed in the direction perpendicular to the mounting surface, the fourth terminal portion and the sixth terminal portion are symmetric with respect to the second hypothetical line.

11. The electronic component according to claim 1, wherein the first side of the first terminal portion is closer to the element than the second side of the first terminal portion is to the element with respect to the direction that is parallel to the first hypothetical line,
wherein the first side of the second terminal portion is closer to the element than the second side of the second terminal portion is to the element with respect to the direction that is parallel to the first hypothetical line.

12. The electronic component according to claim 1, the second side of the first terminal portion is closer to the element than the first side of the first terminal portion is to the element with respect to the direction that is parallel to the first hypothetical line,
wherein the second side of the second terminal portion is closer to the element than the first side of the second terminal portion is to the element with respect to the direction that is parallel to the first hypothetical line.

13. An image forming apparatus comprising:
a photosensitive member;
an exposure portion configured to form an electrostatic latent image by scanning the photosensitive member with laser light;
a developing portion configured to form a toner image by developing the electrostatic latent image formed by the exposure portion with toner;
a transferring portion configured to transfer the toner image on the photosensitive member to a recording material; and
the electrical device according to claim 1,
wherein the element is a sensor element including a light receiving portion for receiving the laser light.

14. The electronic component according to claim 13, wherein, as viewed in the direction perpendicular to the mounting surface, the first terminal portion has (i) a third side that connects the first side of the first terminal portion and the second side of the first terminal portion and (ii) a fourth side that connects the first side of the first terminal portion and the second side of the first terminal portion, the third side of the first terminal portion and the fourth side of the first terminal portion are symmetric with respect to the first hypothetical line,
wherein, as viewed in the direction perpendicular to the mounting surface, the second terminal portion has (i) a third side that connects the first side of the second terminal portion and the second side and (ii) a fourth side of the second terminal portion that connects the first side of the second terminal portion and the second side of the second terminal portion, the third side of the second terminal portion and the fourth side of the second terminal portion are symmetric with respect to the first hypothetical line, and
wherein the third side of the first terminal portion and the third side of the second terminal portion are symmetric with respect to the second hypothetical line, the fourth side of the first terminal portion and the fourth side of the second terminal portion are symmetric with respect to the second hypothetical line.

15. The electronic component according to claim 14, wherein, as viewed in the direction perpendicular to the mounting surface, a first part of the third side of the first terminal portion forms a straight line in a direction that is parallel to the first hypothetical line, a second part of the third side of the first terminal portion forms a straight line in a direction that is parallel to the second hypothetical line, and a third part of the third side of the first terminal portion connects the first side of the first terminal portion and the second part of the third side of the first terminal portion.

16. The electronic component according to claim 15, wherein the third part of the third side of the first terminal portion forms a straight line in the direction that is parallel to the first hypothetical line.

17. The electronic component according to claim 16, wherein a length of the third part of the third side of the first terminal portion with respect to the direction that is parallel to the first hypothetical line is shorter than a length of the first part of the third side of the first terminal portion with respect to the direction that is parallel to the first hypothetical line.

18. The electronic component according to claim 15, wherein a length of the third part of the third side of the first terminal portion with respect to the direction that is parallel to the first hypothetical line is shorter than a length of the first part of the third side of the first terminal portion with respect to the direction that is parallel to the first hypothetical line.

19. The electronic component according to claim 13, the electronic component includes a third terminal portion, a fourth terminal portion, a fifth terminal portion, and a sixth terminal portion each mounted on the mounting surface,
- wherein, as viewed in the direction perpendicular to the mounting surface, the first terminal portion is located between the third terminal portion and the fourth terminal portion, and the third terminal portion and the fourth terminal portion are symmetric with respect to the first hypothetical line,
- wherein, as viewed in the direction perpendicular to the mounting surface, the second terminal portion is located between the fifth terminal portion and the sixth terminal portion, and the fifth terminal portion and the sixth terminal portion are symmetric with respect to the first hypothetical line.

20. The electronic component according to claim 19, wherein, as viewed in the direction perpendicular to the mounting surface, the third terminal portion and the fifth terminal portion are symmetric with respect to the second hypothetical line,
- wherein, as viewed in the direction perpendicular to the mounting surface, the fourth terminal portion and the sixth terminal portion are symmetric with respect to the second hypothetical line.

21. The electronic component according to claim 13, wherein the first side of the first terminal portion is closer to the element than the second side of the first terminal portion is to the element with respect to the direction that is parallel to the first hypothetical line,
- wherein the first side of the second terminal portion is closer to the element than the second side of the second terminal portion is with respect to the element the direction that is parallel to the first hypothetical line.

* * * * *